United States Patent
Ieong et al.

(10) Patent No.: US 7,986,761 B2
(45) Date of Patent: Jul. 26, 2011

(54) SHIFT REGISTER AND LIQUID CRYSTAL DISPLAY DEVICE USING SAME

(75) Inventors: Man-Fai Ieong, Miao-Li (TW); Sz-Hsiao Chen, Miao-Li (TW)

(73) Assignees: Innocom Technology (Shenzhen) Co., Ltd., Shenzhen, Guangdong Province (CN); Chimel Innolux Corporation, Miao-Li County (TW)

( * ) Notice: Subject to any disclaimer, the term of this patent is extended or adjusted under 35 U.S.C. 154(b) by 845 days.

(21) Appl. No.: 12/005,804

(22) Filed: Dec. 27, 2007

(65) Prior Publication Data

US 2008/0158133 A1  Jul. 3, 2008

(30) Foreign Application Priority Data

Dec. 29, 2006  (TW) ................................ 95149701 A

(51) Int. Cl.
*G11C 19/00* (2006.01)

(52) U.S. Cl. ................. 377/64; 377/68; 377/78; 377/79
(58) Field of Classification Search .................... 377/64, 377/68, 69, 77–81
See application file for complete search history.

(56) References Cited

U.S. PATENT DOCUMENTS

| | | | |
|---|---|---|---|
| 6,885,723 B2 * | 4/2005 | Yu ................................... | 377/78 |
| 7,027,550 B2 | 4/2006 | Lin | |
| 7,310,402 B2 * | 12/2007 | Wei et al. ......................... | 377/64 |
| 7,436,923 B2 * | 10/2008 | Tobita .............................. | 377/64 |
| 7,825,888 B2 * | 11/2010 | Tobita et al. ................... | 345/100 |
| 2005/0008114 A1 | 1/2005 | Moon | |
| 2008/0080661 A1 * | 4/2008 | Tobita .............................. | 377/78 |
| 2008/0101529 A1 * | 5/2008 | Tobita .............................. | 377/64 |

* cited by examiner

*Primary Examiner* — Tuan Lam
(74) *Attorney, Agent, or Firm* — Wei Te Chung

(57) ABSTRACT

An exemplary shift register (20) includes shift register units (S1~Sn). The shift register units receive a clock signal and an inverse clock signal and output a plurality of shift register signals in sequence. An output of previous adjacent one of the shift register units is an input of the shift register unit.

20 Claims, 4 Drawing Sheets

SHIFT REGISTER AND LIQUID CRYSTAL DISPLAY DEVICE USING SAME

FIELD OF THE INVENTION

This invention relates to a shift register typically used in a driving circuit of a liquid crystal display device, the shift register configured to provide shift register signals that do not overlap.

GENERAL BACKGROUND

Shift registers are core circuit units of integrated circuits that are used in products such as thin film transistor liquid crystal displays (TFT-LCDs). A shift register provides sequential pulse signals to scanning lines of a TFT LCD, so as to control on and off states of TFTs connected to the scanning lines.

Referring to FIG. 5, this is a circuit diagram of a shift register unit 100 of a typical shifter register. The shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives an output signal VS from a pre-stage shift register unit (not shown). The output signal VS functions as a start signal.

The first clock inversion circuit 110 includes a first transistor M1, a second transistor M2, a third transistor M3, a fourth transistor M4, a first output VO1, and a second output VO2. The first transistor M1 includes a gate for receiving the start signal VS, a source coupled to a first voltage (VDD) such as a power voltage, and a drain coupled to a source of the second transistor M2. The second transistor M2 includes a gate and a drain both coupled to a second voltage (VSS) such as a grounding voltage. The third transistor M3 includes a source coupled to the source of the second transistor M2, a drain serving as the first output VO1, and a gate coupled to a gate of the fourth transistor M4. The gates of the third and fourth transistors M3 and M4 serve as a control terminal to receive a clock signal $\overline{TS}$. The fourth transistor M4 includes a source coupled to a start signal VS, and a drain serving as the second output VO2.

The inverter 120 includes a fifth transistor M5 and a sixth transistor M6. The inverter 120 outputs an output signal that serves as the shift register signal VO. The fifth transistor M5 includes a source coupled to the first voltage VDD, a gate coupled to the drain of the third transistor M3, and a drain coupled to a source of the sixth transistor M6. The drain of the fifth transistor M5 and the source of the sixth transistor M6 serve as an output for outputting the shift register signal VO. The sixth transistor M6 further includes a gate coupled to the drain of the fourth transistor M4, and a drain coupled to the second voltage VSS.

The second clock inversion circuit 130 and the first clock inversion circuit 120 have similar structures. The second clock inversion circuit 130 includes a seventh transistor M7, an eighth transistor M8, a ninth transistor M9, and a tenth transistor M10. The seventh transistor M7 includes a gate for receiving the output signal VO from the inverter 12, a source coupled to the first voltage VDD, and a drain coupled to the a source of the eighth transistor M8. The eighth transistor M8 further includes a gate and a drain coupled to the second voltage VSS. The ninth transistor M9 includes a source coupled to the source of the eighth transistor M8, a gate coupled to a gate of the tenth transistor M10, and a drain coupled to the gate of the fifth transistor M5. The gates of the ninth and tenth transistors M9 and M10 serve as a control terminal for receiving an inverse clock signal TS. The tenth transistor M10 further includes a source coupled to the gate of the seventh transistor M7 and the shift register signal VO of the inverter 120, and a drain coupled to the gate of the sixth transistor M6 via the second output VO2.

Referring to FIG. 6, this is a sequence waveform diagram of pulse signals of the shift register unit 100. During period t1, the third and fourth transistors M3 and M4 are switched off and the ninth and tenth transistors M9 and M10 are switched on because the start signal VS jumps to a low voltage and the clock signal $\overline{TS}$ jumps to a high voltage. Thus, the inverter 120 and the second clock inversion circuit 130 perform latch operation. The sixth transistor M6 is switched off such that the shift register signal VO of the inverter 120 keeps an original state of the previous stage.

During period t2, the third and fourth transistors M3 and M4 are switched on and the ninth and tenth transistors M9 and M10 are switched off because the clock signal $\overline{TS}$ jumps to a low voltage and the inverse clock signal TS jumps to a high voltage. Thus, there is no latch operation. The start signal VS is applied to the inverter 120, and the inverter 120 and the second clock inversion circuit 130 keep the same state as the start signal VS. Further, the first transistor M1 is switched on because the start signal VS jumps to a low voltage, such that the fifth transistor M5 is switched off and the sixth transistor M6 is switched on. Thus, the inverter 120 outputs the shift register signal VO having a low level through the activated sixth transistor M6.

During period t3, the third and fourth transistors M3 and M4 are switched off and the ninth and tenth transistors M9 and M10 are switched on because the clock signal $\overline{TS}$ jumps to a high voltage and the inverse clock signal TS jumps to a low voltage. Therefore the inverter 120 and the second clock inversion circuit 130 perform latch operation. Thus, the shift register signal VO of the inverter 120 keeps the original state of period t2. The seventh transistor M7 is switched on by the shift register signal VO from the inverter 120, such that the transistor M5 is still off. In addition, the sixth transistor M6 maintains on state because the shift register signal VO is low level. Thus, the inverter 120 maintains output of a low level shift register signal VO through the activated sixth transistor M6.

During period t4, the third and fourth transistors M3 and M4 are switched on and the ninth and tenth transistors M9 and M10 are switched off because the clock signal $\overline{TS}$ jumps to a low voltage and the inverse clock signal TS jumps to a high voltage. Thus, there is no latch operation. The start signal VS is applied to the inverter 120. The inverter 120 and the second clock inversion circuit 130 keep the same state as the start signal VS. The sixth and first transistors M6 and M1 are switched off and the fifth transistor M5 is switched on because the start signal VS is high level. Thus, the inverter 120 stops output of the low-level shift register signal VO.

The shift register unit 100 outputs a low level shift register signal during period t2, and at the same time, the next-stage shift register unit (not shown) also outputs a low level shift register signal. Thus, the adjacent shift register units may cause a conflict of signal outputting due to the overlapping of the adjacent shift register signals. As a result, the shift register is liable to be unstable. Accordingly, an LCD device using the shift register has impaired display quality because adjacent scanning lines corresponding to adjacent columns or rows of TFTs may be scanned simultaneously by the shift register pulse signals instead of being scanned sequentially.

What is needed, therefore, is a shift register which can overcome the above-described deficiencies. What is also needed is an LCD device including the shift register.

SUMMARY

In one preferred embodiment, a shift register includes a plurality of shift register units. The shift register units receive a clock signal and an inverse clock signal and output a plurality of shift register signals in sequence. An output of previous adjacent one of the shift register units is an input of the shift register unit.

Other novel features and advantages will become more apparent from the following detailed description when taken in conjunction with the accompanying drawings.

DETAILED DESCRIPTION OF PREFERRED EMBODIMENTS

Figure 1:
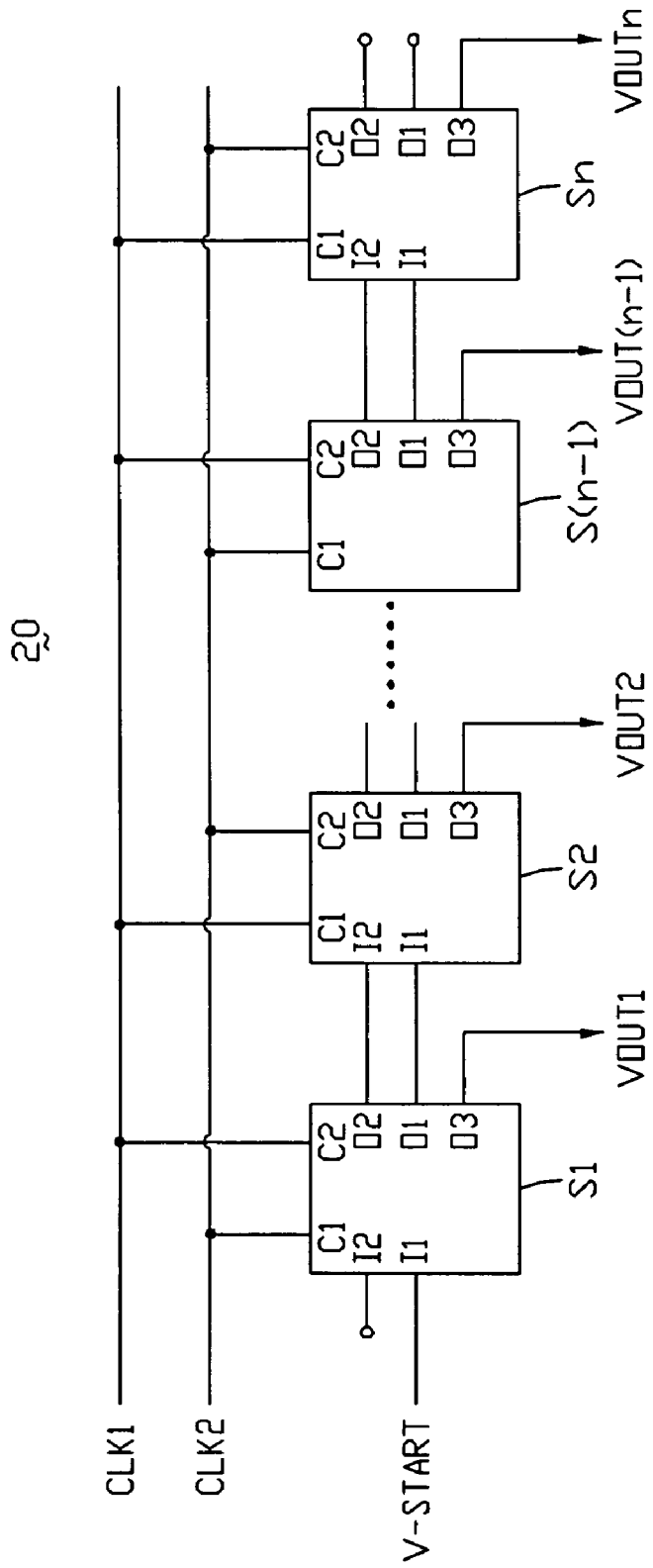
FIG. 1 is an abbreviated circuit diagram of a shift register according to an exemplary embodiment of the present invention, the shift register including a plurality of shift register units.

Referring to FIG. 1, a circuit diagram of a shift register 20 according to an exemplary embodiment of the present invention is shown. The shift register 20 includes a plurality of shift register units S1~Sn connected in series. The shift register units S1~Sn have the same circuit structure. The shift register units S1~Sn each include a first input I1, a second input I2, a first output O1, a second output O2, a third output O3, a first clock input C1, and a second clock input C2. The first input I1 is connected to the first output O1 of a pre-stage shift register unit (not shown). The second input I2 is connected to the second output O2 of the pre-stage shift register unit. The first clock input C1 and the second clock input C2 are provided with two different clock signals. The two clock signals are denoted as CLK1 and CLK2 respectively. The clock signals CLK1 and CLK2 are identical in amplitude, duty ratio, and frequency, but are inverse in phase relative to each other. A duty ratio of the clock signals can be 50%. The third output O3 is configured for outputting a shift register signal to an external circuit (not shown). The first input I1 of the first shift register unit S1 has a start signal V-START applied thereto. The second input I2 of the first shift register unit S1 is a floating input. The first and second outputs O1, O2 of the last shift register unit Sn are floating outputs. It should be noted that the first clock input C1 of each shift register unit S1~Sn and the second clock input C2 of the pre-stage shift register unit have the same clock signal applied thereto. The second clock input C2 of each shift register unit S1~Sn and the first clock input C1 of the pre-stage shift register unit have the same clock signal applied thereto.

Figure 2:
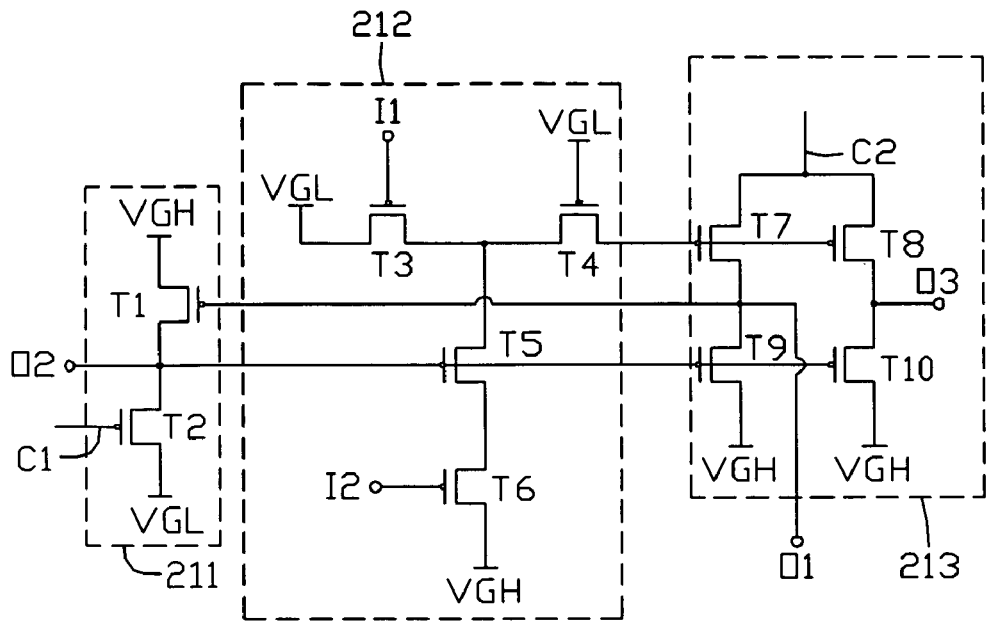
FIG. 2 is a circuit diagram of one of the shift register units of FIG. 1.

Referring also to FIG. 2, a circuit diagram of one of the shift register units S1~Sn is shown. The shift register unit includes a first inversion circuit 211, a second inversion circuit 212, and a third inversion circuit 213. The first inversion circuit 211 includes a first transistor T1 and a second transistor T2. A gate of the first transistor T1 is connected to the first output O1, a source of the first transistor T1 has a high level voltage VGH (such as a power voltage) applied thereto, and a drain of the first transistor T1 is connected to a drain of the second transistor T2. A gate of the second transistor T2 is connected to the first clock input C1, and a source of the second transistor T2 has a low level voltage VGL (such as a grounding voltage) applied thereto. The drain of the first transistor T1 is further connected to the second output O2.

The second inversion circuit 212 includes a third transistor T3, a fourth transistor T4, a fifth transistor T5, and a sixth transistor T6. The low level voltage VGL is connected to the high level voltage VGH via a source and a drain of the third transistor T3, a drain and a source of the fifth transistor T5, and a drain and a source of the sixth transistor T6. A gate of the third transistor T3 is connected to the first input I1. A gate of the fifth transistor T5 is connected to the second output O2. A gate of the sixth transistor T6 is connected to the second input I2. A gate of the fourth transistor T4 has the low level voltage VGL applied thereto, a source of the fourth transistor T4 is connected to the drain of the third transistor T3, and a drain of the fourth transistor T4 is connected to the third inversion circuit 213.

The third inversion circuit 213 includes a seventh transistor T7, an eighth transistor T8, a ninth transistor T9, and a tenth transistor T10. The second clock input C2 is connected to the high level voltage VGH via a source and a drain of the seventh transistor T7 and a drain and a source of the ninth transistor T9, and also via a source and a drain of the eighth transistor T8 and a drain and a source of the tenth transistor T10. The drain of the seventh transistor T7 is further connected to the first output O1. The drain of the eighth transistor T8 is further connected to the third output O3. All the first through tenth transistors T1~T10 are PMOS transistors.

Figure 3:
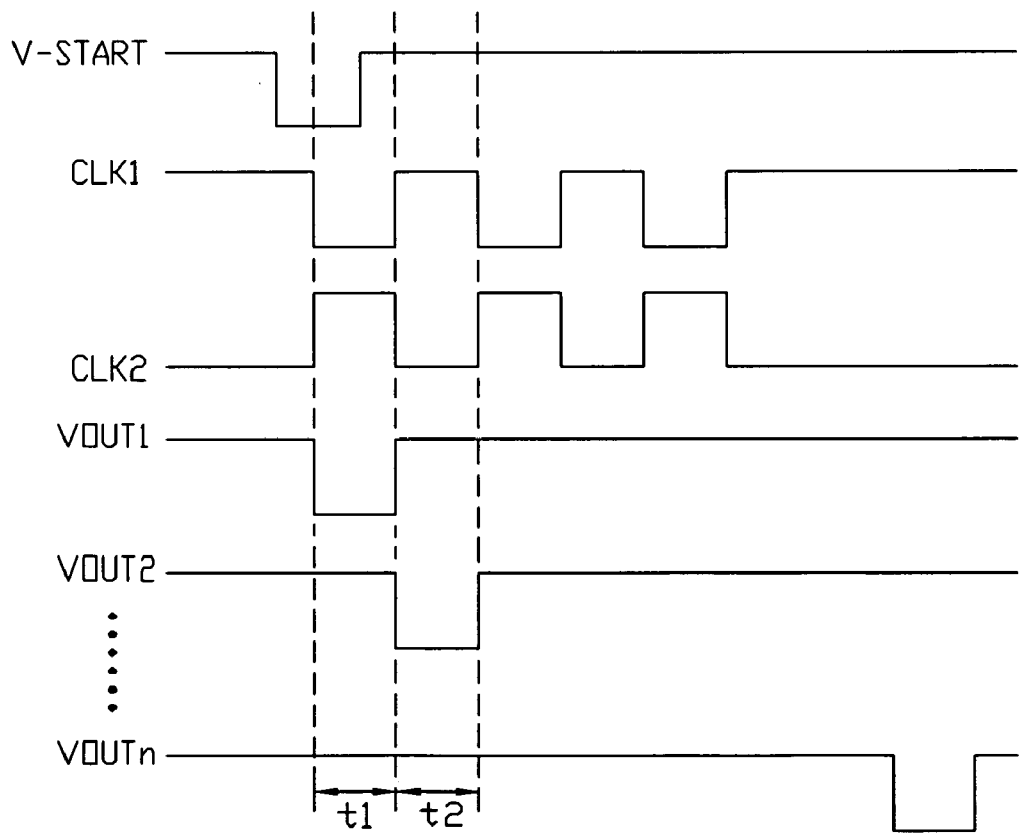
FIG. 3 is a sequence waveform diagram of pulse signals of the shift register of FIG. 1.

Referring also to FIG. 3, a sequence waveform diagram of pulse signals of the shift register 20 is shown. It is assumed that the shift register 20 is switched on at the beginning of period t1. During period t1, the start signal V-START is changed to a high level from a low level. The clock signal CLK1 is at a low level, and the inverse clock signal CLK2 is at a high level. The second transistor T2 of the first shift register unit S1 is in an off state. When the first input I1 is at a low level, the third transistor T3 is switched on. The fourth transistor T4 is in an on state all the time. The low level voltage VGL is applied to the gates of the seventh transistor T7 and the eighth transistor T8 via the activated third transistor T3 and the activated fourth transistor T4. The low level voltage VGL serves as a control signal, which can turn on the gates of the seventh transistor T7 and the eighth transistor T8. Thus, the seventh transistor T7 and the eighth transistor T8 are switched on. The low level clock signal CLK1 is applied to the first output O1 via the second clock input C2 and the activated seventh transistor T7, and is further applied to the third output O3 via the second clock input C2 and the activated eighth transistor T8. The third output O3 outputs a low level signal VOUT1 to the external circuit. The first output O1 outputs a low level voltage to the second shift register unit S2. The first transistor T1 is switched on, and the high level voltage VGH is applied to the second output O2 via the activated first transistor T1. When the first input I1 jumps to a low level, the third transistor T3 is switched off, and the gates of the seventh transistor T7 and the eighth transistor T8 maintain a low level.

During period t1, the first input I1 of the second shift register unit S2 receives a low level voltage from the first (i.e. pre-stage) shift register unit S1, so that the third transistor T3 is switched on. The second input I2 of the second shift register unit S2 receives a high level voltage from the first shift register unit S1, so that the sixth transistor T6 is switched off. The first clock input C1 receives a low level clock signal CLK1, so that the second transistor T2 is switched on, and the low level voltage VGL is applied to the second output O2 via the activated second transistor T2. Thus, the gates of the fifth transistor T5, the ninth transistor T9, and the tenth transistor T10 are all at a low level. The high level voltage VGH is applied to the first output O1 via the activated ninth transistor T9 and is applied to the third output O3 via the activated tenth transistor T10. The fourth transistor T4 is switched on all the time, so that the low level voltage VGL is applied to the gates of the seventh transistor T7 and the eighth transistor T8.

During period t2, in the first shift register S1, the first clock input C1 receives a low level clock signal CLK2. The second clock input C2 receives a high level clock signal CLK1. The first input I1 receives a high level start signal V-START. The second transistor T2 is turned on. The high level voltage VGH is applied to the second output O2 via the activated second transistor T2. The gates of the fifth transistor T5, the ninth transistor T9, and the tenth transistor T10 are switched off. The gates of the seventh transistor T7 and the eighth transistor T8 maintain a low level the same as during period t1. The high level clock signal CLK1 is applied to the first output O1 via the activated seventh transistor T7, and further to the third output O3 via the activated eighth transistor T8. The first output O1 and the third output O3 therefore are both at a high level. Accordingly, the signal VOUT1 is at a high level.

During period t2, in the second shift register unit S2, the first clock input C1 receives a high level clock signal CLK1, so that the eighth transistor T8 is switched off. The second clock input C2 receives a low level clock signal CLK2. The first input I1 receives a high level voltage from the first shift register unit S1. The second input I2 receives a high level voltage from the first shift register unit S1. The third transistor T3 is switched off. The gates of the seventh transistor T7 and the eighth transistor T8 maintain a low level, so that the seventh transistor T7 and the eighth transistor T8 are switched on. The low level clock signal CLK2 is applied to the first output O1 via the activated seventh transistor T7, and further applied to the third output O3 via the activated eighth transistor T8. Thus, the third output O3 outputs a low level signal VOUT2 to the external circuit.

The working principle of the shift register units S3~Sn is similar to that of the first shift register unit S1 and the second shift register unit S2. The second shift register unit S2 outputs a shift register signal VOUT2, and the shift register signal VOUT2 serves as a start signal for a third shift register unit S3 (not shown). A shift register signal VOUT3 output by the third shift register unit S3 serves as a start signal for a fourth shift register unit S4 (not shown). Thus, the shift register units S1~Sn sequentially output a plurality of shift register signals VOUT1~VOUTn. Once one of the shift register units S1~Sn outputs a low level signal, the pre-stage shift register unit's output is turned to a high level. That is, at any moment, only one of the pulse signals VOUT1~VOUTn is at a low level.

Figure 4:
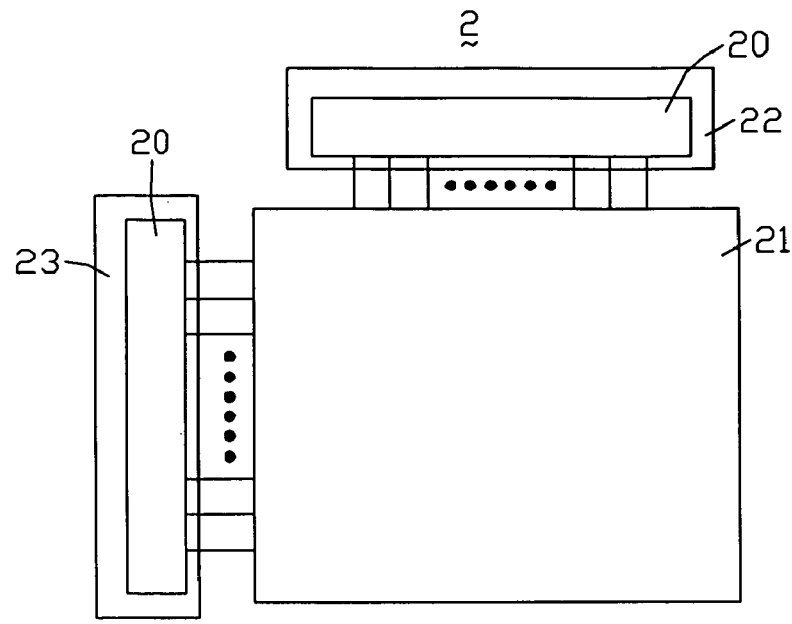
FIG. 4 is an abbreviated block diagram of an LCD device including the shift register of FIG. 1.
Figure 5:
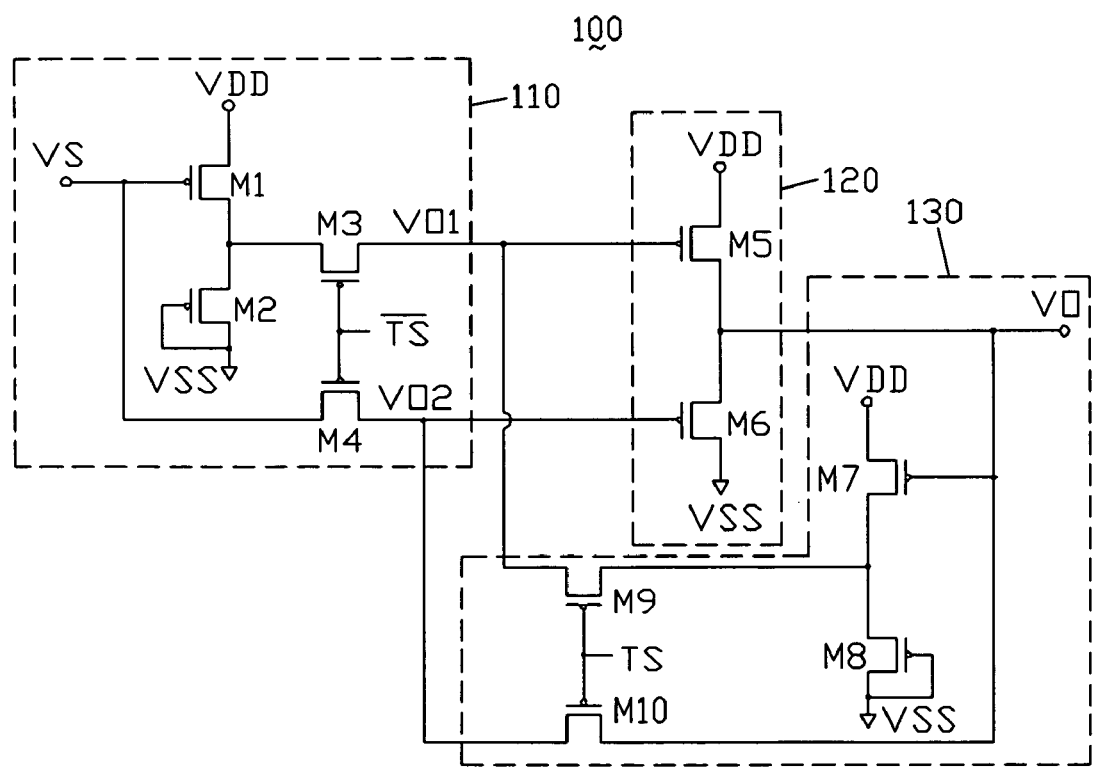
FIG. 5 is a circuit diagram of a shift register unit of a conventional shift register.
Figure 6:
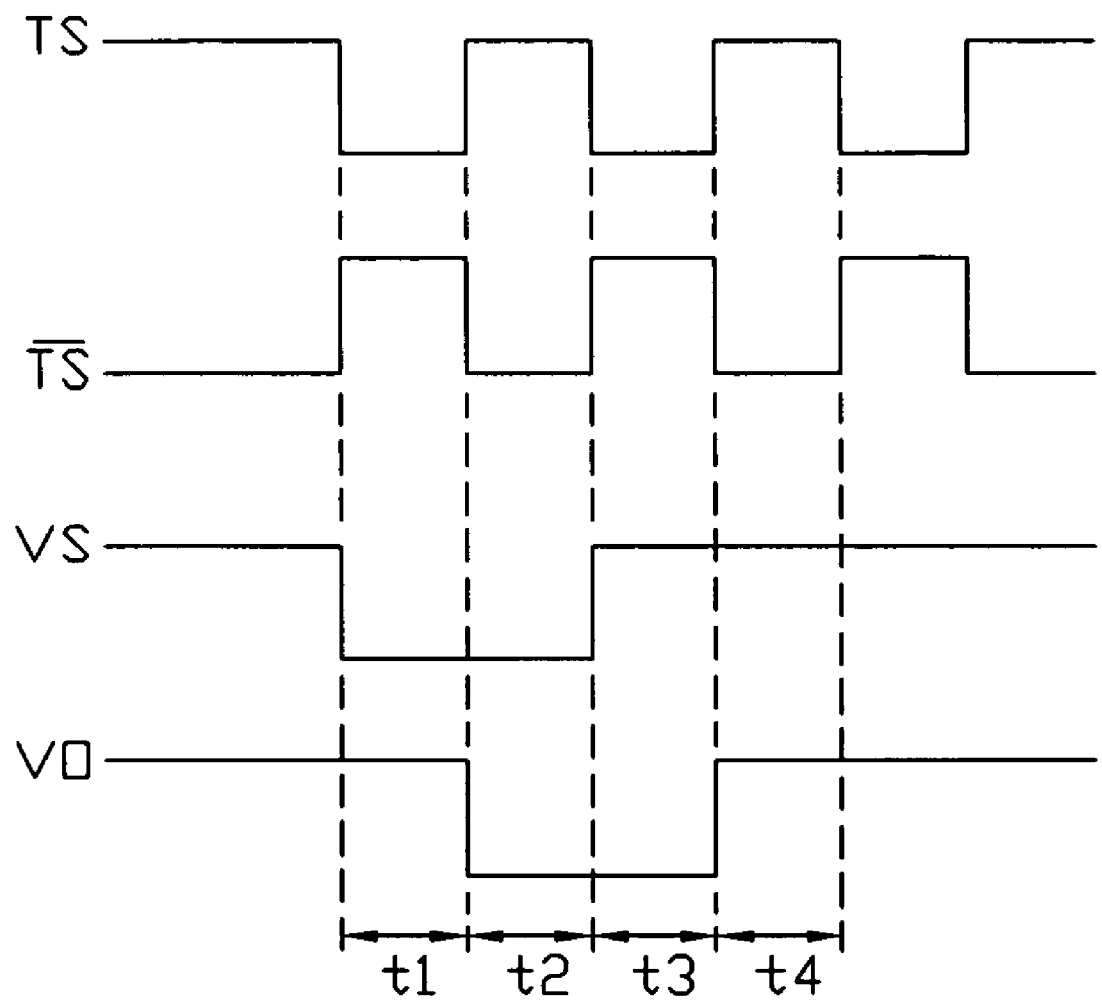
FIG. 6 is a sequence waveform diagram of pulse signals of the shift register of FIG. 5.

Referring to FIG. 4, a liquid crystal display 2 according to an exemplary embodiment of the present invention is shown. The liquid crystal display 2 includes a liquid crystal panel 21, a gate driving circuit 23, and a data driving circuit 22. The data driving circuit 22 and the gate driving circuit 23 each include at least one shift register 20. Each shift register 20 provides a plurality of shift register signals sequentially to the liquid crystal panel 21.

In an alternative embodiment, the eighth transistor T8, the tenth transistor T10 and the third output O3 can be omitted. In such a case, the first output O1 is configured for outputting a low level signal to the external circuit.

It is to be further understood that even though numerous characteristics and advantages of the present embodiments have been set out in the foregoing description, together with details of the structures and functions of the embodiments, the disclosure is illustrative only, and that changes may be made in detail, especially in matters of shape, size, and arrangement of parts within the principles of the invention to the full extent indicated by the broad general meaning of the terms in which the appended claims are expressed.

What is claimed is:

1. A shift register for providing a plurality of low level shift register signals, the shift register comprising:
   a plurality of shift register units connected in series, each shift register unit comprising a first inversion circuit, a second inversion circuit, and a third inversion circuit;
   the first inversion circuit being configured for providing a second output signal according to a clock signal from an external circuit and a first output signal from the third inversion circuit, the first inversion circuit comprising a first transistor and a second transistor, the source of the first transistor being coupled to a high level voltage, the drain of the first transistor being coupled to the drain of the second transistor, the gate of the first transistor being coupled to the third inversion circuit, the source of the second transistor being coupled to a low level voltage, the gate of the second transistor being coupled to the external circuit to receive the clock signal, and the drain of the first transistor being configured for providing the second output signal;
   the second inversion circuit being configured for providing a control signal according to a first output signal from a previous adjacent one of the shift register units and a second output signal from the previous adjacent shift register unit, except in the case of a first one of the shift register units, wherein the second inversion circuit is configured for providing a control signal according to a first external output signal and a second external output signal from the external circuit;
   the third inversion circuit being configured for providing the first output signal and a shift register signal according to the control signal, the second output signal and an inverse clock signal from the external circuit;
   wherein the two first inversion circuits of adjacent shift register units respectively receive the clock signal and the inverse clock signal, the two third inversion circuits of adjacent shift register units respectively receive the clock signal and the inverse clock signal, and the first shift register unit receives a start signal from the external circuit to start the shift register.

2. The shift register in claim 1, wherein the second inversion circuit comprises a third transistor, a fourth transistor, a fifth transistor, and a sixth transistor, the source of the third transistor being coupled to the low level voltage, the drain of the third transistor being coupled to the source of the fourth transistor, the gate of the fourth transistor being coupled to the low level voltage, the source of the sixth transistor being coupled to the high level voltage and being coupled to the source of the fourth transistor via the drain of the sixth transistor and the source and the drain of the fifth transistor, the gate of the fifth transistor being coupled to the drain of the first transistor, and the gate of the third transistor being coupled to the previous adjacent shift register unit to receive the first output signal therefrom, except in the case of the first shift register unit wherein the gate of the third transistor is coupled to the external circuit.

3. The shift register in claim 2, wherein the third inversion circuit comprises a seventh transistor, an eighth transistor, a ninth transistor, and a tenth transistor, the source of the seventh transistor being coupled to the external circuit to receive the inverse clock signal and being coupled to the high level voltage via the drain of the seventh transistor and the source and the drain of the ninth transistor, the source of the eighth transistor being coupled to the external circuit to receive the inverse clock signal and being coupled to the high level voltage via the drain of the eighth transistor and the source and the drain of the tenth transistor, the gates of the seventh and eighth transistors being coupled to the drain of the fourth transistor, the gates of the ninth and tenth transistors being coupled to the gate of the fifth transistor, the drain of the seventh transistor being configured for providing the first output signal, the drain of the eighth transistor being configured for providing the shift register signal.

4. The shift register in claim 3, wherein the first, second, third, fourth, fifth, sixth, seventh, eighth, ninth, and tenth transistors are P-channel metal oxide semiconductor transistors.

5. The shift register in claim 1, wherein a duty ratio of the clock signal is equal to 50%.

6. The shift register in claim 1, wherein the start signal is a low level signal.

7. A shift register for providing a plurality of low level shift register signals, the shift register comprising a plurality of shift register units connected in series, each shift register unit comprising a first inversion circuit, a second inversion circuit, and a third inversion circuit;
the first inversion circuit comprising a first transistor and a second transistor, a source of the first transistor being coupled to a high level voltage, a drain of the first transistor being coupled to a drain of the second transistor, a source of the second transistor being coupled to a low level voltage, a gate of the first transistor being coupled to the third inversion circuit, and a gate of the second transistor being coupled to a clock signal source;
the second inversion circuit comprising a third transistor, a fourth transistor, a fifth transistor, and a sixth transistor, a source of the third transistor being coupled to the low level voltage, a drain of the third transistor being coupled to a source of the fourth transistor, a gate of the fourth transistor being coupled to the low level voltage, a source of the sixth transistor being coupled to the high level voltage and being coupled to the source of the fourth transistor via a drain of the sixth transistor, a gate of the fifth transistor being coupled to the drain of the first transistor, a drain of the fifth transistor being coupled to a first output of a previous adjacent one of the shift register units, except in the case of a first one of the shift register units, wherein the drain of the fifth transistor coupled to an external circuit;
the third inversion circuit comprising a seventh transistor and an eighth transistor, a source of the seventh transistor being coupled to an inverse clock signal source and being coupled to the high level voltage via a drain of the seventh transistor and a source and a drain of the eighth transistor, a gate of the seventh transistor being coupled to the drain of the fourth transistor, a gate of the eighth transistor being coupled to the gate of the fifth transistor;
wherein the two first inversion circuits of two adjacent shift register units receive the clock signal and the inverse clock signal, and the two third inversion circuits of the two adjacent shift register units receive the clock signal and the inverse clock signal, and the first shift register unit receives a start signal from the external circuit to start the shift register.

8. The shift register in claim 7, wherein the third inversion circuit further comprises a ninth transistor and a tenth transistor, the source of the ninth transistor being coupled to the inverse clock signal source and being coupled to the high level voltage via the drain of the ninth transistor and the source and the drain of the tenth transistor, the gate of the ninth transistor being coupled to the gate of the seventh transistor, and the gate of the tenth transistor being coupled to the gate of the eighth transistor.

9. The shift register in claim 7, wherein the start signal is a low level signal.

10. The shift register in claim 7, wherein a duty ratio of the clock signal is 50%.

11. The shift register in claim 8, wherein the first, second, third, fourth, fifth, sixth, seventh, eighth, ninth, and tenth transistors are P-channel metal oxide semiconductor transistors.

12. A liquid crystal display comprising:
a liquid crystal panel;
a gate driving circuit; and
a data driving circuit;
each of the gate driving circuit and the data driving circuit comprising at least one shift register, each of the shift registers comprising a plurality of shift register units, each shift register unit comprising a first inversion circuit, a second inversion circuit, and a third inversion circuit;
the first inversion circuit being configured for providing a second output signal according to a clock signal from an external circuit and a first output signal from the third inversion circuit;
the second inversion circuit being configured for providing a control signal according to a first output signal from a previous adjacent one of the shift register units and a second output signal from the previous adjacent shift register unit, except in the case of a first one of the shift register units, wherein the second inversion circuit is configured for providing a control signal according to a first external output signal from the external circuit and a second external output signal from an external circuit;
the third inversion circuit being configured for providing the first output signal and a shift register signal according to the control signal, the second output signal and an inverse clock signal from the external circuit;
wherein the two first inversion circuits of adjacent shift register units respectively receive the clock signal and the inverse clock signal, the two third inversion circuits of adjacent shift register units respectively receive the clock signal and the inverse clock signal, the first shift register unit receives a start signal as the first external output signal from the external circuit to start the shift register, each of the shift register units further comprises a first and a second inputs and a first, a second and a third outputs, the first and the second inputs of each of the shift register units respectively coupled the first and the second outputs of the previous adjacent one of the shift register units, except in the case of the first one of the shift register units wherein the first and the second inputs thereof are configured for respectively receiving the first and the second external output signals from the external circuit, the first and the second outputs of each of the shift register units respectively coupled to the first and the second inputs of a following adjacent one of the shift register units to provide the first and the second output signals to the following adjacent one of the shift register units, and the third output of each of the shift register units being configured for providing the shift register signal.

13. The liquid crystal display in claim 12, wherein all the transistors in the shift register are P-channel metal oxide semiconductor transistors.

14. The liquid crystal display in claim 12, wherein a duty ratio of the clock signal is equal to 50%.

15. The liquid crystal display in claim 12, wherein the start signal is a low level signal.

16. The liquid crystal display in claim 12, wherein the first inversion circuit comprises a first transistor and a second transistor, the source of the first transistor being coupled to a high level voltage, the drain of the first transistor being coupled to the drain of the second transistor, the gate of the first transistor being coupled to the third inversion circuit, the source of the second transistor being coupled to a low level voltage, the gate of the second transistor being coupled to the external circuit to receive the clock signal, and the drain of the first transistor being configured for providing the second output signal.

17. The liquid crystal display in claim 16, wherein the second inversion circuit comprises a third transistor, a fourth transistor, a fifth transistor, and a sixth transistor, the source of the third transistor being coupled to the low level voltage, the drain of the third transistor being coupled to the source of the fourth transistor, the gate of the fourth transistor being coupled to the low level voltage, the source of the sixth transistor being coupled to the high level voltage and being coupled to the source of the fourth transistor via the drain of the sixth transistor and the source and the drain of the fifth transistor, the gate of the fifth transistor being coupled to the drain of the first transistor, and the gate of the third transistor being coupled to the previous adjacent shift register unit to receive the first output signal therefrom, except in the case of the first shift register unit wherein the gate of the third transistor is coupled to the external circuit.

18. The liquid crystal display in claim 17, wherein the third inversion circuit comprises a seventh transistor, an eighth transistor, a ninth transistor, and a tenth transistor, the source of the seventh transistor being coupled to the external circuit to receive the inverse clock signal and being coupled to the high level voltage via the drain of the seventh transistor and the source and the drain of the ninth transistor, the source of the eighth transistor being coupled to the external circuit to receive the inverse clock signal and being coupled to the high level voltage via the drain of the eighth transistor and the source and the drain of the tenth transistor, the gates of the seventh and eighth transistors being coupled to the drain of the fourth transistor, the gates of the ninth and tenth transistors being coupled to the gate of the fifth transistor, the drain of the seventh transistor being configured for providing the first output signal, the drain of the eighth transistor being configured for providing the shift register signal.

19. The shift register in claim 1, wherein each of the shift register units further comprises a first and a second inputs and a first, a second and a third outputs, the first and the second inputs of each of the shift register units respectively coupled the first and the second outputs of the previous adjacent one of the shift register units, except in the case of the first one of the shift register units wherein the first and the second inputs thereof are configured for respectively receiving the first and the second external output signals from the external circuit, the first and the second outputs of each of the shift register units respectively coupled to the first and the second inputs of a following adjacent one of the shift register units to provide the first and the second output signals to the following adjacent one of the shift register units, and the third output of each of the shift register units being configured for providing the shift register signal.

20. The shift register in claim 7, wherein each of the shift register units further comprises a first and a second inputs and a first, a second and a third outputs, the first and the second inputs of each of the shift register units respectively coupled the first and the second outputs of the previous adjacent one of the shift register units, except in the case of the first one of the shift register units wherein the first and the second inputs thereof are coupled to the external circuit, the first and the second outputs of each of the shift register units respectively coupled to the first and the second inputs of a following adjacent one of the shift register units, and the third output of each of the shift register units being configured for providing a shift register signal.

* * * * *